(12) United States Patent
Moden

(10) Patent No.: US 6,512,303 B2
(45) Date of Patent: Jan. 28, 2003

(54) FLIP CHIP ADAPTOR PACKAGE FOR BARE DIE

(75) Inventor: Walter L. Moden, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/911,160

(22) Filed: Jul. 23, 2001

(65) Prior Publication Data

US 2001/0040299 A1 Nov. 15, 2001

Related U.S. Application Data

(63) Continuation of application No. 09/483,483, filed on Jan. 14, 2000, now Pat. No. 6,265,766, which is a continuation of application No. 08/948,936, filed on Oct. 10, 1997, now Pat. No. 6,201,304, which is a continuation of application No. 08/574,662, filed on Dec. 19, 1995, now Pat. No. 5,719,440.

(51) Int. Cl.[7] .......................... H01L 29/40; H01L 23/28
(52) U.S. Cl. .................. 257/778; 257/781; 257/783
(58) Field of Search ........................ 257/778, 781, 257/782, 777, 783, 787; 438/108, 118

(56) References Cited

U.S. PATENT DOCUMENTS

| 4,446,477 A | 5/1984 | Currie et al. ............... 257/697 |
|---|---|---|
| 4,975,765 A | 12/1990 | Ackermann et al. ......... 257/737 |
| 5,086,018 A | 2/1992 | Conru et al. .................. 29/827 |
| 5,099,309 A | 3/1992 | Kryzaniwsky .............. 257/700 |
| 5,107,329 A | 4/1992 | Okinaga et al. ............. 257/698 |
| 5,218,234 A | 6/1993 | Thompson et al. .......... 257/787 |
| 5,222,014 A | 6/1993 | Lin .............................. 361/792 |
| 5,239,198 A | 8/1993 | Lin et al. ..................... 257/693 |
| 5,286,679 A | 2/1994 | Farnworth et al. .......... 242/521 |
| 5,293,068 A | 3/1994 | Kohno et al. ................ 257/676 |
| 5,313,096 A | 5/1994 | Eide .............................. 257/686 |
| 5,384,689 A | 1/1995 | Shen ........................... 361/761 |
| 5,434,106 A | 7/1995 | Lim et al. .................... 310/239 |
| 5,434,452 A | 7/1995 | Higgins ....................... 257/773 |
| 5,473,512 A | 12/1995 | Degani et al. ............... 257/760 |
| 5,486,723 A | 1/1996 | Ma et al. ...................... 257/707 |
| 5,508,556 A | 4/1996 | Lin .............................. 257/691 |
| 5,541,450 A | 7/1996 | Jones et al. .................. 257/697 |
| 5,615,089 A | 3/1997 | Yoneda et al. ............... 361/764 |
| 5,636,104 A | 6/1997 | Oh ............................... 361/777 |
| 5,637,915 A | 6/1997 | Sato et al. .................... 257/666 |
| 5,674,785 A | 10/1997 | Akram et al. ................. 438/18 |
| 5,714,405 A | 2/1998 | Tsubosaki et al. ........... 438/118 |
| 5,933,710 A | 8/1999 | Chia et al. ................... 438/123 |
| 5,952,611 A | 9/1999 | Eng et al. ................... 174/52.4 |
| 6,013,946 A | 1/2000 | Lee et al. ..................... 257/684 |
| 6,013,948 A | 1/2000 | Akram et al. ................ 257/698 |
| 6,046,072 A | 4/2000 | Matsuura et al. ............ 438/118 |
| 6,048,755 A | 4/2000 | Jiang et al. .................. 438/118 |
| 6,091,140 A | 7/2000 | Toh et al. ..................... 257/730 |
| 6,097,085 A | 8/2000 | Ikemizu et al. .............. 257/678 |
| 6,262,477 B1 | 7/2001 | Mahulikar et al. ........... 257/698 |
| 6,265,766 B1 * | 7/2001 | Moden ......................... 257/678 |

FOREIGN PATENT DOCUMENTS

| JP | 4-30544 | 2/1992 |
|---|---|---|
| JP | 4-107964 | 4/1992 |
| JP | 40728274 | 10/1995 |

* cited by examiner

*Primary Examiner*—Jasmine J B Clark
(74) *Attorney, Agent, or Firm*—TraskBritt

(57) ABSTRACT

A board for connecting a bare semiconductor die with a bond pad arrangement which does not conform to a master printed circuit board with a specific or standardized pin out, connector pad, or lead placement arrangement. The board comprises a printed circuit board including first elements, such as minute solder balls, pins, or bond wires, for making electrical contact between the board and the master board, and second elements, such as minute solder balls, pins, or bond wires, for making electrical contact between the semiconductor die and the board. The board has circuit traces for electrical communication between the board/master board electrical contact elements, and the semiconductor die board electrical contact elements.

114 Claims, 3 Drawing Sheets

FLIP CHIP ADAPTOR PACKAGE FOR BARE DIE

CROSS REFERENCE TO RELATED APPLICATIONS

This application is a continuation of application Ser. No. 09/483,483, filed Jan. 14, 2000, now U.S. Pat. No. 6,265,766, issued Jul. 24, 2001, which is a continuation of application Ser. No. 08/948,936, filed Oct. 10, 1997, now U.S. Pat. No. 6,201,304 B1, issued Mar. 13, 2001, which is a continuation of application Ser. No. 08/574,662, filed Dec. 19, 1995, now U.S. Pat. No. 5,719,440, issued Feb. 17, 1998.

BACKGROUND OF THE INVENTION

1. Field of the Invention

The present invention relates to an apparatus for connecting a bare semiconductor die having a size and bond pad arrangement, either solder ball arrangement, or pin arrangement (hereinafter referred to generally as a "terminal arrangement"), which does not conform to a printed circuit board with a specific or standardized pin out, connector pad, or lead placement (hereinafter referred to generally as a "connection arrangement"). More particularly, the present invention relates to an intermediate conductor-carrying substrate (hereinafter referred to generally as an "adaptor board") for connecting a non-conforming bare die to another printed circuit board having a given connection arrangement (hereinafter referred to generally as a "master board").

2. State of the Art

Definitions: The following terms and acronyms will be used throughout the application and are defined as follows:

BGA—Ball Grid Array: An array of minute solder balls disposed on an attachment surface of a semiconductor die wherein the solder balls are refluxed for simultaneous attachment and electrical communication of the semiconductor die to a printed circuit board.

COB—Chip On Board: The techniques used to attach semiconductor dice to a printed circuit board, including flip chip attachment, wirebonding, and tape automated bonding ("TAB").

Flip Chip: A chip or die that has bumped terminations spaced around the active surface of the die and is intended for facedown mounting.

Flip Chip Attachment: A method of attaching a semiconductor die to a substrate in which the die is flipped so that the connecting conductor pads on the face of the die are set on mirror-image pads on the substrate (i.e. printed circuit board) and bonded by refluxing the solder.

Glob Top: A glob of encapsulant material (usually epoxy or silicone or a combination thereof) surrounding a semiconductor die in the COB assembly process.

PGA—Pin Grid Array: An array of small pins extending substantially perpendicularly from the major plane of a semiconductor die, wherein the pins conform to a specific arrangement on a printed circuit board for attachment thereto.

SLICC—Slightly Larger than Integrated Circuit Carrier: An array of minute solder balls disposed on an attachment surface of a semiconductor die similar to a BGA, but having a smaller solder ball pitch and diameter than a BGA.

State-of-the-art COB technology generally consists of three semiconductor dies to printed circuit boards attachment techniques: flip chip attachment, wirebonding, and TAB.

Flip chip attachment consists of attaching a semiconductor die, generally having a BGA, a SLICC or a PGA, to a printed circuit board. With the BGA or SLICC, the solder ball arrangement on the semiconductor die must be a mirror-image of the connecting bond pads on the printed circuit board such that precise connection is made. The semiconductor die is bonded to the printed circuit board by refluxing the solder balls. With the PGA, the pin arrangement of the semiconductor die must be a mirror-image of the pin recesses on the printed circuit board. After insertion, the semiconductor die is generally bonded by soldering the pins into place. An under-fill encapsulant is generally disposed between the semiconductor die and the printed circuit board to prevent contamination. A variation of the pin-in-recess PGA is a J-lead PGA, wherein the loops of the J's are soldered to pads on the surface of the circuit board. Nonetheless, the lead and pad locations must coincide, as with the other referenced flip chip techniques.

Wirebonding and TAB attachment generally begins with attaching a semiconductor die to the surface of a printed circuit board with an appropriate adhesive. In wirebonding, a plurality of bond wires are attached, one at a time, from each bond pad on the semiconductor die and to a corresponding lead on the printed circuit board. The bond wires are generally attached through one of three industry-standard wirebonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts. The die may be oriented either face up or face down (with its active surface and bond pads either up or down with respect to the circuit board) for wire bonding, although face up orientation is more common. With TAB, metal tape leads are attached between the bond pads on the semiconductor die and the leads on the printed circuit board. An encapsulant is generally used to cover the bond wires and metal tape leads to prevent contamination.

Although the foregoing methods are effective for bonding semiconductor dice to printed circuit boards, the terminal arrangements of the dice and the connection arrangements of the boards must be designed to accommodate one another. Thus, it may be impossible to electrically connect a particular semiconductor die to a printed circuit board for which the semiconductor die terminal arrangement was not designed to match the board's connection arrangement. With either wirebond or TAB attachment, the semiconductor die bond pad may not correspond to the lead ends on the circuit board, and thus attachment is either impossible or extremely difficult due to the need for overlong wires and the potential for inter-wire contact and shorting. With flip chip attachment, if the printed circuit board connection arrangement is not a mirror-image of the solder ball or pin arrangement (terminal arrangement) on the semiconductor die, electrically connecting the flip chip to the printed circuit board is impossible.

Therefore, it would be advantageous to develop an apparatus for connecting a semiconductor die having a size and bond pad arrangement, solder ball arrangement, or pin arrangement ("I/O pattern") which does not conform to a printed circuit board with a specific or standardized pin out, connection pad location, or lead placement ("I/O pattern").

SUMMARY OF THE INVENTION

The present invention relates to an intermediate printed circuit board or other conductor-carrying substrate that functions as an adaptor board for electrically connecting one or more bare semiconductor dice of a variety of sizes and bond pad locations, solder ball arrangement, or pin arrangement, to a master printed circuit board with a specific or standardized pin out, connector pad location, or lead placement.

An adaptor printed circuit board or substrate ("adaptor board") is sized and configured with an I/O pattern to accommodate its attachment to the master printed circuit board ("master board"). If the master board is configured to receive a specific pin out or specific connector pad locations, the adaptor board is configured on its master board attachment surface with pins or solder balls in mirror-image to the master board connection arrangement to make electrical contact with the specific pin out or connector pads on the printed circuit board. If the master board is configured to receive a bond wire, the adaptor board is configured and sized to provide wire bond pads on its upper surface closely adjacent the bond pads of the master board leads. The adaptor board can, of course, be configured to accommodate other attachment and electrical connection means known in the industry, as well as other components in addition to the semiconductor die or dice carried thereon.

On the semiconductor die side of the adaptor board, one or more semiconductor dice are attached. If a "flip chip" die is attached to the adaptor board, the adaptor board will, of course, be configured with an I/O pattern to receive the flip chip with a specific pin out or connector pad locations. The pin out or connector pads on the adaptor board are connected to circuit traces on or through the adaptor board. The circuit traces form the electrical communication path from the pin recesses or connector pads on the adaptor board to the connection points to the master board.

If a "leads over" die is used with the adaptor board, the bond pads on the die are wirebonded to the adaptor board. Preferably, the leads over die is attached to the adaptor board with the bond pads facing the adaptor board. The bond wires are attached to the leads over die bond pads and extend into a via or vias in the adaptor board. The bond wires are attached to an I/O pattern of adaptor board bond pads within the via from which circuit traces extend, or to leads on the master board side of the adaptor board.

It is, of course, understood that the leads over die can be attached to the adaptor board with the bond pads facing away from the adaptor board. Thus, the bond wires are simply attached to the bond pads on the leads over die and to a corresponding I/O pattern of adaptor board pad on the semiconductor die side of the adaptor board.

Preferably, the exposed circuitry of the die and the die-to-adaptor board interconnection is sealed from contamination by a glob top after wire bonding or an underflow compound in the case of a flip chip attachment.

Furthermore, it is understood that with the use of wire bonds, the adaptor boards can be stacked on top of each other and connected to the adaptor board as by wire bonding.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
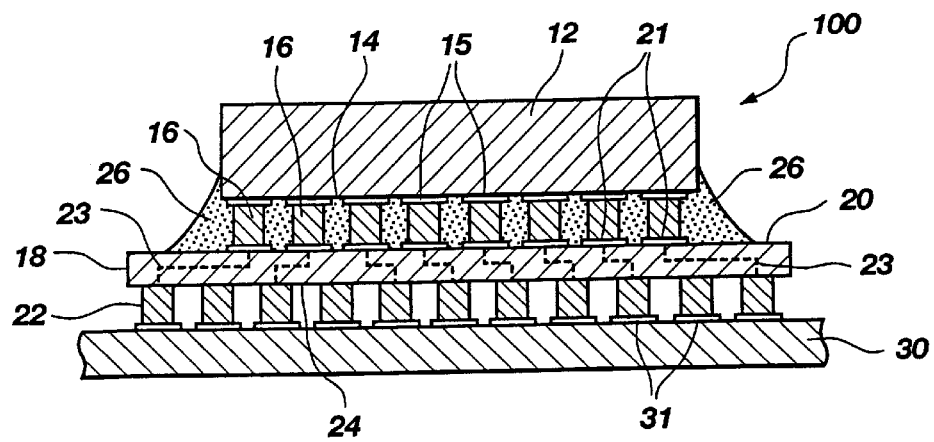
FIG. 1 is a side view of one embodiment of the present invention.

FIG. 1 illustrates a first embodiment of the present invention designated as a flip chip style/flip chip attachment assembly 100. Assembly 100 comprises a semiconductor die 12 having an inverted active surface 14 with at least one flip chip electric connection 16 (such as a C4 solder bump connection, a pin connection, or a surface mount j-lead connection, by way of example) extending substantially perpendicularly from a bond pad 15 on the semiconductor die active surface 14. The flip chip electric connections 16 are attached to an upper surface 20 of an adaptor board 18 in such a manner that the flip chip electric connections 16 make electrical contact with electrical contact elements 21 in or on the surface of adaptor board 18. The electrical contact elements 21 make electrical communication between each flip chip electric connection 16, through circuit traces 23 (exemplary traces shown in broken lines) in the adaptor board 18, to at least one master board connector 22 extending substantially perpendicularly from a lower surface 24 of the adaptor board 18 to connect adaptor board 18 to an aligned terminal 31 on master board 30. Preferably, a sealing compound 26 is disposed between the semiconductor die 12 and the adaptor board 18 to prevent contamination of the flip chip electric connections 16 and to more firmly secure semiconductor die 12 to adaptor board 18.

In actual practice, there will be a plurality of terminals 31 arranged in a specific, perhaps industry-standard pattern, on master board 30, and master board connectors will be arranged in a mirror-image pattern to terminals 31 for mating connection therewith. Master board connectors 22 and terminals 31 may comprise any electrical connection mechanism known in the art, in addition to those previously described herein.

Figure 2:
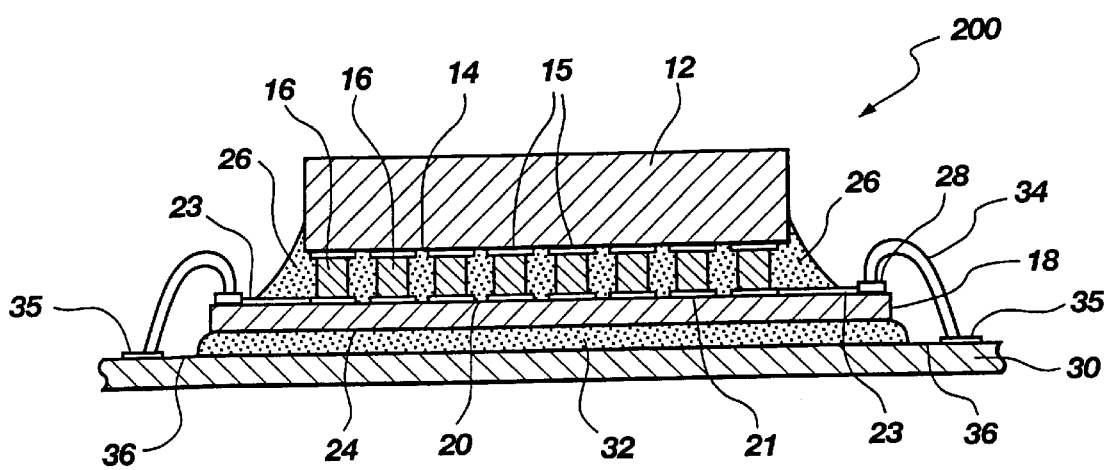
FIG. 2 is a side view of a second embodiment of the present invention.
Figure 2A:
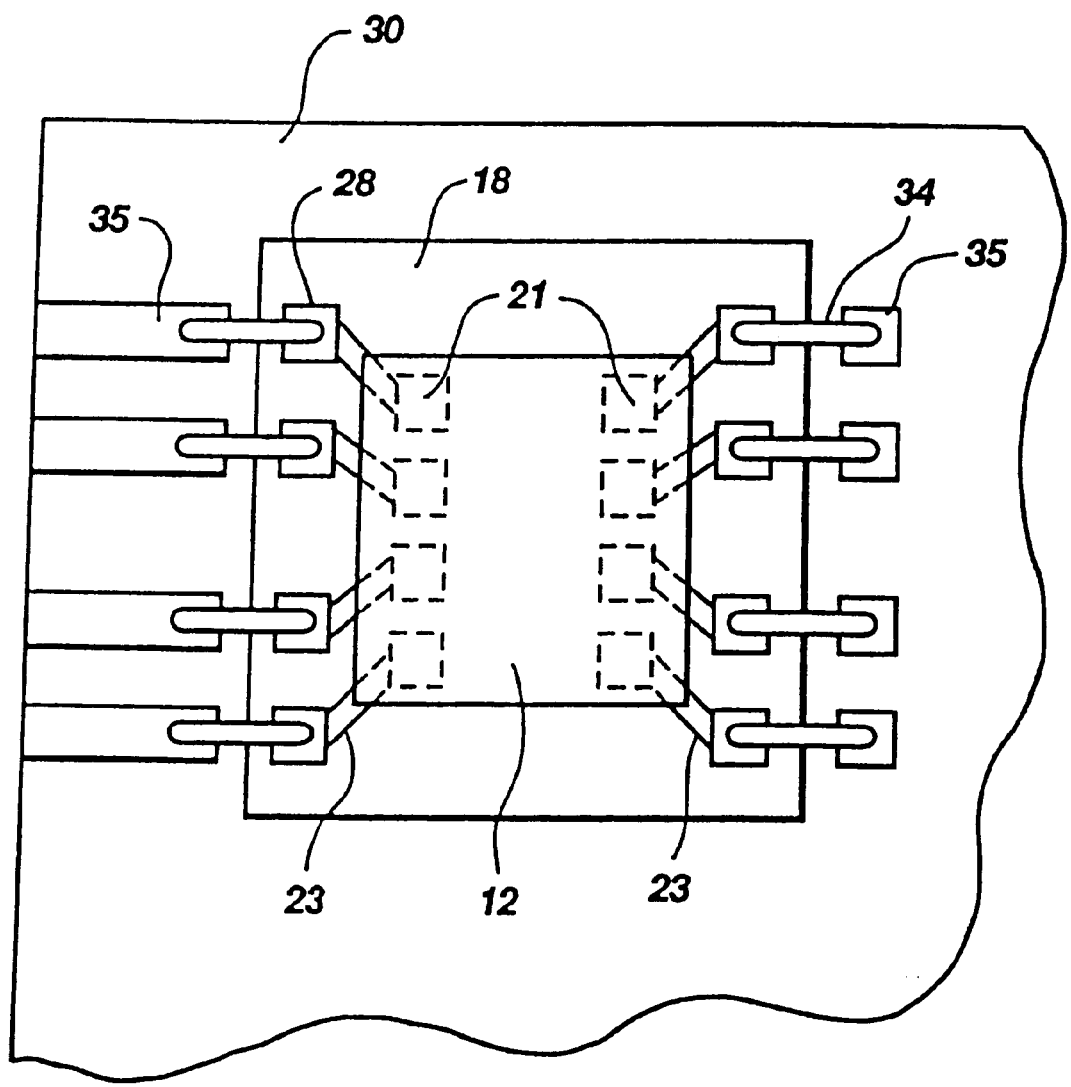
FIG. 2A is a top view of the second embodiment of the present invention shown in FIG. 2.

FIGS. 2 and 2A illustrate a second embodiment of the present invention designated as a flip chip style/wire bond attach assembly 200. Components common to both FIG. 1 and FIG. 2 retain the same numeric designation. The assembly 200 comprises the semiconductor die 12 having active surface 14 with at least one flip chip electric connection 16, as known in the art, extending substantially perpendicularly from a bond pad 15 on the semiconductor die active surface 14. The flip chip electric connections 16 are attached to the adaptor board upper surface 20 in such a manner that the flip chip electric connections 16 make electrical contact with electrical contact elements 21 on the adaptor board 18. The electrical contact elements 21 communicate between each flip chip electric connection 16 to bond pads 28 on the adaptor board upper surface 20 through circuit traces 23. The adaptor board lower surface 24 is bonded to an upper surface 36 of a master board 30 with an adhesive 32, which may comprise a liquid or gel adhesive, or an adhesive tape, all as known in the art. If desired, adhesive 32 may be a heat-conductive adhesive. A wire bond 34 extends from each adaptor board bond pad 28 to a corresponding bond pad or lead end 35 on the upper surface 36 of master board 30, bond pad or lead end 35 communicating with other components mounted to master board 30 or with other components on other boards or other assemblies through circuit traces or other conductors known in the art.

Figure 3:
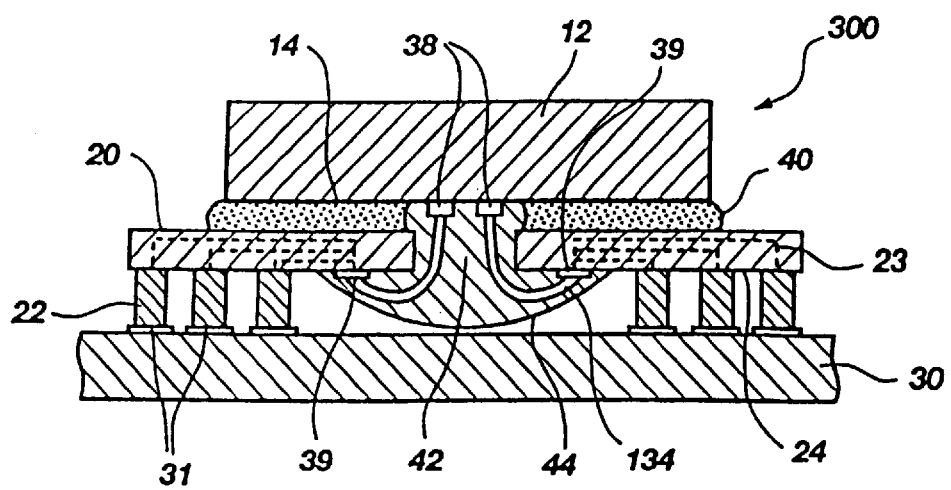
FIG. 3 is a side view of a third embodiment of the present invention.

FIG. 3 illustrates a third embodiment of the present invention designated as a wire bond style/flip chip attach assembly 300. Components which are common to the previous figures retain the same numeric designation. The assembly 300 comprises an inverted semiconductor die 12 having active surface 14 with at least one bond pad 38 on the semiconductor die active surface 14. As illustrated, the bond pads 38 are arranged in two rows extending down the longitudinal axis of semiconductor die 12 being located transverse to the plane of the page, such an arrangement commonly being used for a "leads over" connection to frame leads extending over the die in its normal, upright position. The semiconductor die active surface 14 is bonded to the adaptor board upper surface 20 with an insulating, sealing adhesive 40. The adaptor board 18 includes at least one wire bond via 42 which is located in a position or positions aligned with the semiconductor die bond pads 38. Each individual wire bond 134 is connected to each corresponding individual semiconductor die bond pad 38. Each wire bond 134 extends from the semiconductor die bond pad 38 to a corresponding bond pad or lead 39 on the adaptor board lower surface 24, which communicates with master board connectors 22 through circuit traces 23. The master board terminals 31 are in electrical communication with at least one master board connector 22 extending substantially perpendicularly from the adaptor board lower surface 24. Preferably, a sealant 44 encases the bond wires 134 and seals the wire bond via 42 to prevent contamination and damage to the wire bonds.

Figure 4:
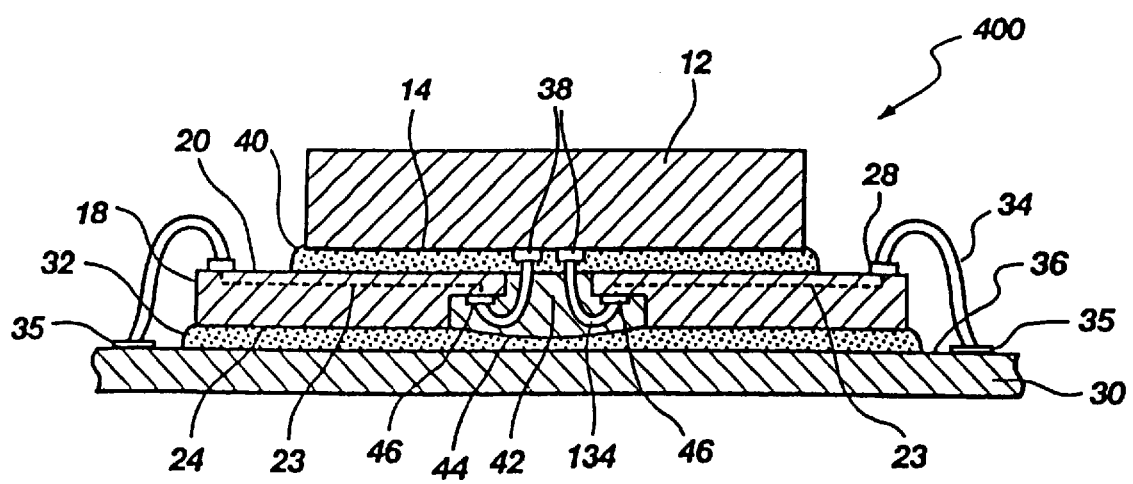
FIG. 4 is a side view of a fourth embodiment of the present invention.

FIG. 4 illustrates a fourth embodiment of the present invention designated as a wire bond style/wire bond attach assembly 400. Components which are common to the previous figures retain the same numeric designation. The assembly 400 comprises the semiconductor die 12 having active surface 14 with at least one bond pad 38 on the semiconductor die active surface 14. As with the embodiment of FIG. 3, semiconductor die 12, in this instance, employs bond pads 38 in a "leads over" configuration. The semiconductor die active surface 14 is bonded to the master board upper surface 20 with an insulating, sealing adhesive 40. The adaptor board 18 includes at least one wire bond via 42 which is located in a position or positions aligned with the semiconductor die bond pads 38. Each individual wire bond 134 is connected to each corresponding semiconductor die bond pad 38. Each wire bond 134 extends from the semiconductor die bond pad 38 to a corresponding bond pad 46 within the wire bond via 42. The via bond pads 46 are in electrical communication through circuit traces 23 with at least one corresponding adaptor board bond pad 28. The adaptor board lower surface 24 is bonded to the master board upper surface 36 with the adhesive 32. Wire bonds 34 extend from the master board upper surface 20 to a corresponding bond pad or lead on the master board upper surface 36. Preferably, the wire bond via sealant 44 encases the bond wires 134 and seals the wire bond via 42 to prevent contamination.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A substrate having a plurality of circuits thereon for connecting a bare semiconductor die having a plurality of bond pads on a portion of a surface thereof to another substrate, said substrate using a plurality of bond wires to connect the plurality of bond pads on said bare semiconductor die and the plurality of circuits on said substrate, comprising:

a substrate including at least a portion of a printed circuit board having a first die side surface for attaching a portion of the surface having a plurality of bond pads of said bare semiconductor die thereto, a second attachment surface having a plurality of bond pads located thereon for connecting said plurality of bond wires thereto, at least one via extending therethrough for having a portion of said plurality of bond wires extending therethrough, and a plurality of circuit traces having at least one circuit trace connected to at least one bond pad of said plurality of bond pads of said second attachment surface for connecting to said plurality of bond wires for connecting to said plurality of bond pads of said bare semiconductor die and for electrically connecting between said bare semiconductor die and said another substrate; and at least a portion of a plurality of electrical connectors located on the second attachment surface of the substrate for electrically connecting said substrate and said another substrate, the at least a portion of a plurality of electrical connectors for connecting to the plurality of circuit traces.

2. The substrate of claim 1, wherein the plurality of electrical connectors comprise a plurality of solder balls.

3. The substrate of claim 1, wherein the plurality of electrical connectors comprise a plurality of pins.

4. The substrate of claim 1, wherein the plurality of circuit traces comprise a plurality of circuit traces having at least one circuit trace of the plurality of circuit traces having a portion thereof located in the substrate.

5. The substrate of claim 1, wherein the plurality of circuit traces comprise a plurality of circuit traces having at least one circuit trace of the plurality of circuit traces having a portion thereof located on the second attachment surface of the substrate.

6. The substrate of claim 1, wherein the plurality of circuit traces comprise a plurality of circuit traces having at least one circuit trace of the plurality of circuit traces having a portion thereof located on the second attachment surface of the substrate and a portion thereof located in the substrate.

7. The substrate of claim 1, wherein the plurality of circuit traces comprise a plurality of circuit traces having at least one circuit trace of the plurality of circuit traces having a portion thereof located on the first die side surface of the substrate.

8. The substrate of claims 1, wherein the plurality of circuit traces comprise a plurality of circuit traces having at least one circuit trace of the plurality of circuit traces having a portion thereof located on the first die side surface of the substrate and a portion located in the substrate.

9. The substrate of claim 1, where the substrate comprises a printed circuit board.

10. The substrate of claim 1, wherein the substrate further includes a plurality of bond pads connected to the plurality of circuit traces.

11. The substrate of claim 10, wherein the plurality of bond pads are located on the second attachment surface of the substrate.

12. The substrate of claim 10, wherein the plurality of bond pads are located on the first die side surface of the substrate.

13. A substrate having a plurality of circuits for connecting one or more bare semiconductor die to another substrate, each bare semiconductor die of the one or more bare semiconductor die having a plurality of bond pads on a portion of a surface thereof for connecting to said another substrate, said substrate using a plurality of bond wires for connecting between the plurality of bond pads on said each bare semiconductor die of said one or more bare semiconductor die and said plurality of circuits on said substrate, comprising:

a multilayer substrate having a first die side surface for attaching thereto a portion of the surface having a plurality of bond pads of said one or more bare semiconductor die, a second attachment surface having a plurality of bond pads located thereon for connecting said plurality of bond wires thereto, one or more vias extending therethrough for said plurality of bond wires to extend therethrough from said plurality of bond pads of said one or more bare semiconductor die, and a plurality of circuit traces having at least one circuit trace connected to at least one bond pad of said plurality of bond pads of said second attachment surface for connecting said plurality of bond wires connected to said plurality of bond pads of said one or more bare semiconductor die and for electrically connecting between said one or more bare semiconductor die and said another substrate; and a plurality of electrical connectors located on the second attachment surface of the substrate for electrically connecting said substrate and said another substrate, the plurality of electrical connectors connected to the plurality of circuit traces.

14. The substrate of claim 13, wherein the plurality of electrical connectors comprise a plurality of solder balls.

15. The substrate of claim 13, wherein the plurality of electrical connectors comprise a plurality of pins.

16. The substrate of claim 13, wherein the plurality of circuit traces comprise a plurality of circuit traces having at least one circuit trace of the plurality of circuit traces having a portion thereof located in the substrate.

17. The substrate of claim 13, wherein the plurality of circuit traces comprise a plurality of circuit traces having at least one circuit trace of the plurality of circuit traces having a portion thereof located on the second attachment surface of the substrate.

18. The substrate of claim 13, wherein the plurality of circuit traces comprise a plurality of circuit traces having at least one circuit trace of the plurality of circuit traces having a portion thereof located on the second attachment surface of the substrate and a portion thereof located in the substrate.

19. The substrate of claim 13, wherein the plurality of circuit traces comprise a plurality of circuit traces having at least one circuit trace of the plurality of circuit traces having a portion thereof located on the first die side surface of the substrate.

20. The substrate of claim 13, wherein the plurality of circuit traces comprise a plurality of circuit traces having at least one circuit trace of the plurality of circuit traces having a portion thereof located on the first die side surface of the substrate and a portion located in the substrate.

21. The substrate of claim 13, wherein the substrate comprises a printed circuit board.

22. The substrate of claim 13, wherein the substrate further includes a plurality of bond pads connected to the plurality of circuit traces.

23. The substrate of claim 22, wherein the plurality of bond pads are located on the second attachment surface of the substrate.

24. A substrate having a plurality of circuits thereon for connecting a plurality of bare semiconductor die to another substrate, each bare semiconductor of said plurality of bare semiconductor die having a plurality of bond pads on a portion of a surface thereof for connecting to said another substrate, said substrate using a plurality of bond wires for connecting between the plurality of bond pads on said plurality of bare semiconductor die and a plurality of circuits on said substrate, comprising:

a substrate having at least one layer, having a first die side surface for attaching thereto a portion of the surface having a plurality of bond pads of said plurality of bare semiconductor die, a second attachment surface having a plurality of bond pads located thereon for connecting of said plurality of bond wires thereto, a plurality of vias extending therethrough for said plurality of bond wires to extend therethrough from said plurality of bond pads of said plurality of bare semiconductor die, and a plurality of circuit traces having at least one circuit trace connected to at least one bond pad of said plurality of bond pads of said second attachment surface for connection to said plurality of bond wires connected to said plurality of bond pads of said plurality of bare semiconductor die and for electrically connecting between said plurality of bare semiconductor die and said another substrate; and a plurality of electrical connectors located on the second attachment surface of the substrate for electrically connecting said substrate and said another substrate, the plurality of electrical connectors for connecting to the plurality of circuit traces.

25. The substrate of claim 24, wherein the plurality of electrical connectors comprise a plurality of solder balls.

26. The substrate of claim 24, wherein the plurality of electrical connectors comprise a plurality of pins.

27. The substrate of claim 24, wherein the plurality of circuit traces comprise a plurality of circuit traces having at least one circuit trace of the plurality of circuit traces having a portion thereof located in the substrate.

28. The substrate of claim 24, wherein the plurality of circuit traces comprise a plurality of circuit traces having at least one circuit trace of the plurality of circuit traces having a portion thereof located on the second attachment surface of the substrate.

29. The substrate of claim 24, wherein the plurality of circuit traces comprise a plurality of circuit traces having at least one circuit trace of the plurality of circuit traces having a portion thereof located on the second attachment surface of the substrate and a portion thereof located in the substrate.

30. The substrate of claim 24, wherein the plurality of circuit traces comprise a plurality of circuit traces having at least one circuit trace of the plurality of circuit traces having a portion thereof located on the first die side surface of the substrate.

31. The substrate of claim 24, wherein the plurality of circuit traces comprise a plurality of circuit traces having at least one circuit trace of the plurality of circuit traces having a portion thereof located on the first die side surface of the substrate and a portion located in the substrate.

32. The substrate of claim 24, wherein the substrate comprises a printed circuit board.

33. The substrate of claim 24, wherein the substrate further includes a plurality of bond pads connected to the plurality of circuit traces.

34. The substrate of claim 33, wherein the plurality of bond pads are located on the second attachment surface of the substrate.

35. An electrical assembly for connection to a substrate having a plurality of circuits comprising:

a bare semiconductor die having a surface having a plurality of bond pads located thereon;

a substrate having a die side surface, an attachment surface, a via extending through the substrate from the die side surface to the attachment surface, a plurality of circuit traces, and at least one bond pad connected to at least one circuit trace of said plurality of circuit traces, a portion of the surface having the plurality of bond pads of said bare semiconductor die attached to a portion of the die side surface of the substrate;

a plurality of wire bonds for extending through the via extending through the substrate from the die side surface to the attachment surface thereof, the plurality of wire bonds for connection to the plurality of bond pads of the bare semiconductor die and the plurality of circuit traces; and a plurality of electrical connectors located on the attachment surface of the substrate for electrically connecting the substrate and another substrate, the plurality of electrical connectors connected to the plurality of circuit traces.

36. The electrical assembly of claim 35, wherein the electrical connection between the attachment surface of the substrate and said another substrate comprises a plurality of solder balls.

37. The electrical assembly of claim 35, wherein the electrical connection between the attachment surface of the substrate and said another substrate comprises a plurality of pins.

38. The electrical assembly of claim 35, wherein the plurality of circuit traces comprise a plurality of circuit traces having at least one circuit trace of the plurality of circuit traces having a portion thereof located in the substrate.

39. The electrical assembly of claim 35, wherein the plurality of circuit traces comprise a plurality of circuit traces having at least one circuit trace of the plurality of circuit traces having a portion thereof located on the attachment surface of the substrate.

40. The electrical assembly of claim 35, wherein the plurality of circuit traces comprise a plurality of circuit traces having at least one circuit trace of the plurality of circuit traces having a portion thereof located on the attachment surface of the substrate and a portion thereof located in the substrate.

41. The electrical assembly of claim 35, wherein the plurality of circuit traces comprise a plurality of circuit traces having at least one circuit trace of the plurality of circuit traces having a portion thereof located on the die side surface of the substrate.

42. The electrical assembly of claim 35, wherein the plurality of circuit traces comprise a plurality of circuit traces having at least one circuit trace of the plurality of circuit traces having a portion thereof located on the die side surface of the substrate and a portion located in the substrate.

43. The electrical assembly of claim 35, wherein the substrate comprises a printed circuit board.

44. The electrical assembly of claim 35, wherein the substrate further includes a plurality of bond pads connected to the plurality of circuit traces.

45. The electrical assembly of claim 44, wherein the plurality of bond pads are located on the attachment surface of the substrate.

46. The electrical assembly of claim 44, wherein the plurality of bond pads are located on the die side surface of the substrate.

47. The electrical assembly of claim 35, further comprising:

a sealant located in a portion of the via in the substrate encasing at least a portion of the plurality of bond wires.

48. The electrical assembly of claim 35, further comprising:

an adhesive attaching a portion of the surface having a plurality of bond pads of the bare semiconductor die to the die side surface of the substrate having the plurality of bond pads of the bare semiconductor die located in the via extending through the substrate from the die side surface to the attachment surface of the substrate.

49. The electrical assembly of claim 48, wherein the adhesive comprises a sealing adhesive.

50. The electrical assembly of claim 48, wherein the adhesive comprises an adhesive tape.

51. An electrical assembly for connection to a substrate having a plurality of circuits comprising:

at least two bare semiconductor die, each bare semiconductor die of the at least two bare semiconductor die having a surface having a plurality of bond pads located thereon;

a substrate having a die side surface, an attachment surface, at least two vias extending through the substrate from the die side surface to the attachment surface, a plurality of circuit traces, and at least one bond pad connected to at least one circuit trace of said plurality of circuit traces, a portion of the surface having the plurality of bond pads of said each bare semiconductor die of the at least two bare semiconductor die attached to a portion of the die side surface of the substrate;

a plurality of wire bonds for extending through each via of the at least two vias extending through the substrate from the die side surface to the attachment surface thereof, the plurality of wire bonds for connecting the plurality of bond pads of said each bare semiconductor die of the at least two bare semiconductor die and the plurality of circuit traces of the substrate; and a plurality of electrical connectors located on the die side surface of the substrate for electrically connecting the substrate and another substrate, the plurality of electrical connectors connected to the plurality of circuit traces.

52. The electrical assembly of claim 51, wherein the plurality of electrical connectors between the attachment surface of the substrate and said another substrate comprises a plurality of solder balls.

53. The electrical assembly of claim 51, wherein the plurality of electrical connectors between the attachment surface of the substrate and said another substrate comprises a plurality of pins.

54. The electrical assembly of claim 51, wherein the plurality of circuit traces comprise a plurality of circuit traces having at least one circuit trace of the plurality of circuit traces having a portion thereof located in the substrate.

55. The electrical assembly of claim 51, wherein the plurality of circuit traces comprise a plurality of circuit traces having at least one circuit trace of the plurality of circuit traces having a portion thereof located on the attachment surface of the substrate.

56. The electrical assembly of claim 51, wherein the plurality of circuit traces comprise a plurality of circuit traces having at least one circuit trace of the plurality of circuit traces having a portion thereof located on the attachment surface of the substrate and a portion thereof located in the substrate.

57. The electrical assembly of claim 51, wherein the plurality of circuit traces comprise a plurality of circuit traces having at least one circuit trace of the plurality of circuit traces having a portion thereof located on the die side surface of the substrate.

58. The electrical assembly of claim 51, wherein the plurality of circuit traces comprise a plurality of circuit traces having at least one circuit trace of the plurality of circuit traces having a portion thereof located on the die side surface of the substrate and a portion located in the substrate.

59. The electrical assembly of claim 51, wherein the substrate comprises a printed circuit board.

60. The electrical assembly of claim 51, wherein the die substrate further includes a plurality of bond pads connected to the plurality of circuit traces.

61. The electrical assembly of claim 60, wherein the plurality of bond pads are located on the attachment surface of the substrate.

62. The electrical assembly of claim 60, wherein the plurality of bond pads are located on the die side surface of the substrate.

63. The electrical assembly of claim 51, further comprising:
a sealant located in a portion of said each via of the at least two vias in the substrate for encasing at least a portion of the plurality of bond wires.

64. The electrical assembly of claim 51, further comprising:
an adhesive attaching a portion of the surface having a plurality of bond pads of said each bare semiconductor die of the at least two bare semiconductor die to the die side surface of the substrate having the plurality of bond pads of said each bare semiconductor die of the at least two bare semiconductor die located in the at least two vias extending through the substrate from the die side surface to the attachment surface of the substrate.

65. The electrical assembly of claim 64, wherein the adhesive comprises a sealing adhesive.

66. The electrical assembly of claim 64, wherein the adhesive comprises an adhesive tape.

67. An electrical assembly for connection to a substrate having a plurality of circuits comprising:
a plurality of bare semiconductor die, each bare semiconductor die of said plurality of bare semiconductor die having a surface having a plurality of bond pads located thereon;
a substrate having a die side surface; an attachment surface, a plurality of vias extending through the substrate from the die side surface to the attachment surface, a plurality of circuit traces, and at least one bond pad connected to at least one circuit trace of said plurality of circuit traces, a portion of the surface having the plurality of bond pads of said each bare semiconductor die of said plurality of bare semiconductor die for attaching to a portion of the die side surface of the substrate;
a plurality of wire bonds extending through each via of the plurality of vias extending through the substrate from the die side surface to the attachment surface thereof, the plurality of wire bonds for connecting the plurality of bond pads of said each bare semiconductor die of said plurality of bare semiconductor die and the plurality of circuit traces of the substrate; and
a plurality of electrical connectors located on the die side surface of the substrate for electrically connecting the substrate and another substrate, the plurality of electrical connectors for connection to the plurality of circuit traces.

68. The electrical assembly of claim 67, wherein the plurality of electrical connectors between the attachment surface of the substrate and said another substrate comprises a plurality of solder balls.

69. The electrical assembly of claim 67, wherein the plurality of electrical connectors between the attachment surface of the substrate and said another substrate comprises a plurality of pins.

70. The electrical assembly of claim 67, wherein the plurality of circuit traces comprise a plurality of circuit traces having at least one circuit trace of the plurality of circuit traces having a portion thereof located in the substrate.

71. The electrical assembly of claim 67, wherein the plurality of circuit traces comprise a plurality of circuit traces having at least one circuit trace of the plurality of circuit traces having a portion thereof located on the attachment surface of the substrate.

72. The electrical assembly of claim 67, wherein the plurality of circuit traces comprise a plurality of circuit traces having at least one circuit trace of the plurality of circuit traces having a portion thereof located on the attachment surface of the substrate and a portion thereof located in the substrate.

73. The electrical assembly of claim 67, wherein the plurality of circuit traces comprise a plurality of circuit traces having at least one circuit trace of the plurality of circuit traces having a portion thereof located on the die side surface of the substrate.

74. The electrical assembly of claim 67, wherein the plurality of circuit traces comprise a plurality of circuit traces having at least one circuit trace of the plurality of circuit traces having a portion thereof located on the die side surface of the substrate and a portion located in the substrate.

75. The electrical assembly of claim 67, wherein the substrate comprises a printed circuit board.

76. The electrical assembly of claim 67, wherein the substrate further includes a plurality of bond pads connected to the plurality of circuit traces.

77. The electrical assembly of claim 76, wherein the plurality of bond pads are located on the attachment surface of the substrate.

78. The electrical assembly of claim 76, wherein the plurality of bond pads are located on the die side surface of the substrate.

79. The electrical assembly of claim 67, further comprising:
a sealant located in a portion of said each via of the plurality of vias in the substrate for encasing at least a portion of the plurality of bond wires.

80. The electrical assembly of claim 67, further comprising:
an adhesive attaching a portion of the surface having a plurality of bond pads of said each bare semiconductor die of said plurality of bare semiconductor die to the die side surface of the substrate having the plurality of bond pads of said each bare semiconductor die of said plurality of bare semiconductor die located in the plurality of vias extending through the substrate from the die side surface to the attachment surface of the substrate.

81. The electrical assembly of claim 80, wherein the adhesive comprises a sealing adhesive.

82. The electrical assembly of claim 80, wherein the adhesive comprises an adhesive tape.

83. An electrical assembly for connection to a substrate having a plurality of circuits comprising:

a substrate;

a bare semiconductor die having a surface having a plurality of bond pads located thereon;

a substrate having a die side surface, an attachment surface, a via extending through the substrate from the die side surface to the attachment surface, a plurality of circuit traces, and at least one bond pad connected to at least one circuit trace of said plurality of circuit traces, a portion of the surface having the plurality of bond pads of said bare semiconductor die for attaching to a portion of the die side surface of the substrate;

a plurality of wire bonds extending through the via extending through the substrate from the die side surface to the attachment surface thereof, the plurality of wire bonds for connection to the plurality of bond pads of the bare semiconductor die and the plurality of circuit traces; and a plurality of electrical connectors located on the attachment surface of the substrate electrically connecting the substrate and the substrate having a via, the plurality of electrical connectors for connection to the plurality of circuit traces.

84. The electrical assembly of claim 83, wherein the electrical connection between the attachment surface of the substrate and said substrate comprises a plurality of solder balls.

85. The electrical assembly of claim 83, wherein the electrical connection between the attachment surface of the substrate and said substrate comprises a plurality of pins.

86. The electrical assembly of claim 83, wherein the plurality of circuit traces comprise a plurality of circuit traces having at least one circuit trace of the plurality of circuit traces having a portion thereof located in the substrate.

87. The electrical assembly of claim 83, wherein the plurality of circuit traces comprise a plurality of circuit traces having at least one circuit trace of the plurality of circuit traces having a portion thereof located on the attachment surface of the substrate.

88. The electrical assembly of claim 83, wherein the plurality of circuit traces comprise a plurality of circuit traces having at least one circuit trace of the plurality of circuit traces having a portion thereof located on the attachment surface of the substrate and a portion thereof located in the substrate.

89. The electrical assembly of claim 83, wherein the plurality of circuit traces comprise a plurality of circuit traces having at least one circuit trace of the plurality of circuit traces having a portion thereof located on the die side surface of the substrate.

90. The electrical assembly of claim 83, wherein the plurality of circuit traces comprise a plurality of circuit traces having at least one circuit trace of the plurality of circuit traces having a portion thereof located on the die side surface of the substrate and a portion located in the substrate.

91. The electrical assembly of claim 83, wherein the substrate comprises a printed circuit board.

92. The electrical assembly of claim 83, wherein the substrate further includes a plurality of bond pads connected to the plurality of circuit traces.

93. The electrical assembly of claim 92, wherein the plurality of bond pads are located on the attachment surface of the substrate.

94. The electrical assembly of claim 92, wherein the plurality of bond pads are located on the die side surface of the substrate.

95. The electrical assembly of claim 83, further comprising:

a sealant located in a portion of the via in the substrate for encasing at least a portion of the plurality of bond wires.

96. The electrical assembly of claim 83, further comprising:

an adhesive attaching a portion of the surface having a plurality of bond pads of the bare semiconductor die to the die side surface of the substrate having the plurality of bond pads of the bare semiconductor die located in the via extending through the substrate from the die side surface to the attachment surface of the substrate.

97. The electrical assembly of claim 96, wherein the adhesive comprises a sealing adhesive.

98. The electrical assembly of claim 96, wherein the adhesive comprises an adhesive tape.

99. An electrical assembly for connection to a substrate having a plurality of circuits comprising:

a substrate;

a plurality of bare semiconductor die, each bare semiconductor die of said plurality of bare semiconductor die having a surface having a plurality of bond pads located thereon;

a substrate having a die side surface, an attachment surface, a plurality of vias extending through the substrate from the die side surface to the attachment surface, a plurality of circuit traces, and at least one bond pad connected to at least one circuit of said plurality of circuits, a portion of the surface having the plurality of bond pads of said each bare semiconductor die of said plurality of bare semiconductor die for attaching to a portion of the die side surface of the substrate;

a plurality of wire bonds extending through each via of the plurality of vias extending through the substrate from the die side surface to the attachment surface thereof, the plurality of wire bonds for connecting the plurality of bond pads of said each bare semiconductor die of said plurality of bare semiconductor die and the plurality of circuit traces of the substrate; and a plurality of electrical connectors located on the die side surface of the substrate for electrically connecting the substrate and the substrate having a via, the plurality of electrical connectors connected to the plurality of circuit traces.

100. The electrical assembly of claim 99, wherein the plurality of electrical connectors between the attachment surface of the substrate and said substrate comprises a plurality of solder balls.

101. The electrical assembly of claim 99, wherein the plurality of electrical connectors between the attachment surface of the substrate and said substrate comprises a plurality of pins.

102. The electrical assembly of claim 99, wherein the plurality of circuit traces comprise a plurality of circuit traces having at least one circuit trace of the plurality of circuit traces having a portion thereof located in the substrate.

103. The electrical assembly of claim 99, wherein the plurality of circuit traces comprise a plurality of circuit traces having at least one circuit trace of the plurality of circuit traces having a portion thereof located on the attachment surface of the substrate.

104. The electrical assembly of claim 99, wherein the plurality of circuit traces comprise a plurality of circuit traces having at least one circuit trace of the plurality of circuit traces having a portion thereof located on the attachment surface of the substrate and a portion thereof located in the substrate.

105. The electrical assembly of claim 99, wherein the plurality of circuit traces comprise a plurality of circuit traces having at least one circuit trace of the plurality of circuit traces having a portion thereof located on the die side surface of the substrate.

106. The electrical assembly of claim 99, wherein the plurality of circuit traces comprise a plurality of circuit traces having at least one circuit trace of the plurality of circuit traces having a portion thereof located on the die side surface of the substrate and a portion located in the substrate.

107. The electrical assembly of claim 99, wherein the substrate comprises a printed circuit board.

108. The electrical assembly of claim 99, wherein the die substrate further includes a plurality of bond pads connected to the plurality of circuit traces.

109. The electrical assembly of claim 108, wherein the plurality of bond pads are located on the attachment surface of the substrate.

110. The electrical assembly of claim 108, wherein the plurality of bond pads are located on the die side surface of the substrate.

111. The electrical assembly of claim 99, further comprising:

a sealant located in a portion of said each via of the plurality of vias in the die substrate encasing at least a portion of the plurality of bond wires.

112. The electrical assembly of claim 99, further comprising:

an adhesive attaching a portion of the surface having a plurality of bond pads of said each bare semiconductor die of said plurality of bare semiconductor die to the die side surface of the substrate having the plurality of bond pads of said each bare semiconductor die of said plurality of bare semiconductor die located in the plurality of vias extending through the substrate from the die side surface to a second attachment surface of the substrate.

113. The electrical assembly of claim 112, wherein the adhesive comprises a sealing adhesive.

114. The electrical assembly of claim 112, wherein the adhesive comprises an adhesive tape.

* * * * *